United States Patent [19]
Jun

[11] Patent Number: 5,256,248
[45] Date of Patent: Oct. 26, 1993

[54] METHOD FOR PATTERNING SEMICONDUCTOR

[75] Inventor: Young-Kwon Jun, Seoul, Rep. of Korea

[73] Assignee: GoldStar Electron Co., Ltd., Cheongju, Rep. of Korea

[21] Appl. No.: 959,852

[22] Filed: Oct. 13, 1992

[30] Foreign Application Priority Data

Oct. 10, 1991 [KR] Rep. of Korea .............. 91-17725

[51] Int. Cl.$^5$ ............................................. H01L 21/00
[52] U.S. Cl. ................................... 156/653; 156/656; 156/657; 437/228
[58] Field of Search .............. 156/653, 656, 657; 437/228

[56] References Cited

U.S. PATENT DOCUMENTS

| | | | |
|---|---|---|---|
| 4,729,967 | 3/1988 | Armiento | 156/653 |
| 5,026,665 | 6/1991 | Zdebel | 437/228 |
| 5,037,505 | 8/1991 | Tung | 156/653 |
| 5,079,179 | 1/1992 | Josefowicz et al. | 437/228 |

Primary Examiner—Brian E. Hearn
Assistant Examiner—Laura M. Holtzman
Attorney, Agent, or Firm—Alan R. Loudermilk

[57] ABSTRACT

A method for forming a fine pattern of a semiconductor element by using intermediate transcription layers. A layer to be transcribed is formed on a silicon substrate. A first intermediate transcription layer with a thickness of δ and a first mask layer are formed on the layer to be transcribed and are patterned to produce a line width of L and a line space of S, with S approximately equal L +2δ. A second intermediate transcription layer of the same material as the first intermediate transcription layer and with a thickness of δ is formed on the overall surface. A second mask layer with a substantially flattened surface is formed on the second intermediate transcription layer. The flattened second mask layer is etched back so as to expose a portion of the second intermediate transcription layer. A pattern is formed with the first and second intermediate transcription layers by partial isotropic etching of the intermediate transcription layers to produce a line width and line space of the intermediate transcription layers of approximately L/2 and S/2, respectively. The mask layers are removed, and an anisotropic dry etching of the layer to be transcribed is performed using the intermediate layers as a mask. The patterning is completed by removing the intermediate transcription layers.

5 Claims, 2 Drawing Sheets

METHOD FOR PATTERNING SEMICONDUCTOR

FIELD OF THE INVENTION

The present invention relates to a method for patterning semiconductors, and more particularly to a method for forming a fine pattern of a semiconductor element, which may be made with minimum line width and line space of less than 0.2 $\mu$, by forming a pattern of a intermediate transcription layer, and patterning a layer in the formation of the semiconductor element with the minimum line width and space by utilizing the intermediate transcription layer as a mask.

BACKGROUND OF THE INVENTION

Recently, semiconductor fabrication techniques require further fine patterning methods to satisfy the requirement of higher integration. Since there is a limitation to improving the resolution of exposing devices, however, the minimum line width and line space capable of being patterned also are limited.

When the pattern size is reduced to less than a micron, effects relating to the interference and diffraction of light become greater and resolution is decreased. Accordingly, when g-line (wave length of 436 nm) or i-line (wave length of 365 nm) light is used, it is very difficult to make a pattern with less than $0.5\mu$ or $0.4\mu$ as the minimum line width, respectively.

Heretofore, as illustrated in FIG. 1 (A), a pattern has been made (transcribed) in photo-resist 13 on layer 12 on silicon substrate 11 by exposing with light and removing exposed portions by means of an etching process. Thereafter, as illustrated in FIG. 1 (B), photo-resist 13 is used as a mask to pattern layer 12 by etching exposed portions of layer 12, and photo-resist 13 is thereafter removed.

The line width of this pattern is represented as "L", and the line space is "S".

With such a conventional patterning method, when g-line and i-line radiation are used, forming a pattern with less than 0.3 $\mu$ line width and line space is almost impossible due to the limited resolution of the exposing device and resist.

SUMMARY OF THE INVENTION

The present invention aims to overcome the aforementioned conventional patterning limitation.

Accordingly, it is an object of the present invention to provide a method for patterning with a line width and space smaller than those of conventional methods.

The method of the present invention comprises the steps of forming a layer to be transcribed on a silicon substrate, forming a first intermediate transcription layer on the layer to be transcribed with a thickness of $\delta$, forming a mask layer on the first intermediate transcription layer with a material having a large etch rate difference (high-etching selectivity) from the first intermediate transcription layer, and, thereafter, patterning the first mask layer and the first intermediate transcription layer with a line width of L and a line space of $S=L+2\delta$, forming a second intermediate transcription layer by depositing the same material as the first intermediate transcription layer with a thickness of $\delta$, forming a second mask layer by depositing and flattening the same material as the first mask layer, etching back the flattened second mask layer so as to expose a portion of the second intermediate transcription layer on the first mask layer, forming a pattern of the first and second intermediate transcription layers with a line width and a line space to be L/2 and S/2, respectively, by carrying out a partial isotropic etching of the first and second intermediate transcription layers, removing by etching the first and second mask layers, and anisotropic dry etching the layer to be transcribed by using the first and second intermediate transcription layers as the mask, and completing the pattern by removing the intermediate transcription layers.

BRIEF DESCRIPTION OF THE DRAWINGS

The above objects and other advantages of the present invention will become apparent by describing in detail the preferred embodiment of the present invention with reference to the attached drawings in which.

DETAILED DESCRIPTION OF THE INVENTION

The present invention will be explained in more detail with reference to FIG. 2.

Figure 1A:
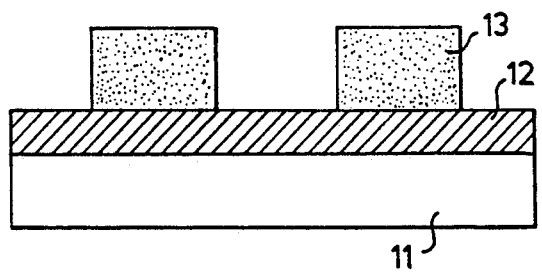
FIGS. 1 (A) and (B) are partial sectional views of a semiconductor for illustration of a conventional process for forming a fine pattern of the semiconductor.
Figure 1B:
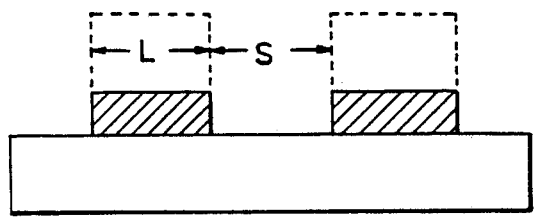
Figure 2A:
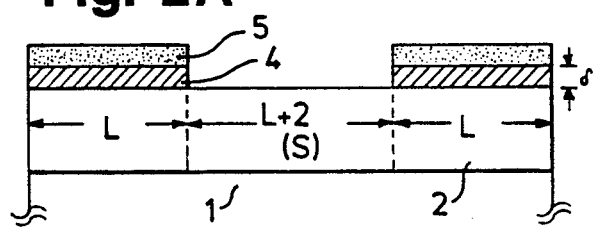
FIGS. 2 (A) to (H) are partial sectional views of a semiconductor for illustration of forming a fine pattern of the semiconductor in accordance with the present invention.

As shown in FIG. 2(A), a layer to be transcribed, layer 2, is formed on silicon substrate 1, and first intermediate transcription layer 4 is formed with a thickness of $\delta$, and first mask layer 5 is formed on first intermediate transcription layer 4. First mask layer 5 is formed of a material which has a large difference in etching rate from first intermediate transcription layer 4.

Patterning is executed so as to make the line width L and the line space $S=L+2\delta$ of first mask layer 5 and first intermediate transcription layer 4 by utilizing a photo-lithographic technique.

At this time, for example, a nitride layer may be used for first intermediate transcription layer 4 and a SOG (spin on glass film) for first mask layer 5.

Figure 2B:
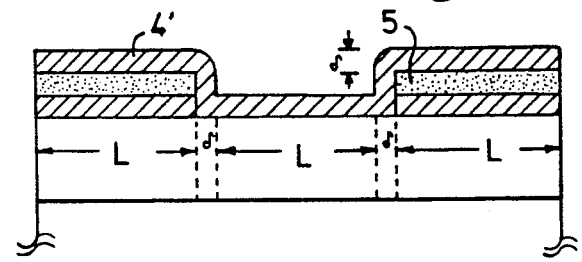

Successively, as shown in FIG. 2(B), second intermediate transcription layer 4" is formed by depositing a layer of material with a thickness of $\delta$, with second intermediate layer 4' consisting of the same material as first intermediate transcription layer 4.

Figure 2C:
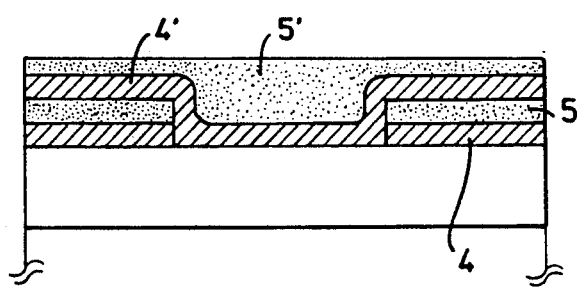

Subsequently, a layer consisting of the same material as first mask layer 5 is deposited and then flattened so that second mask layer 5' is formed as shown in FIG. 2(C).

Figure 2D:
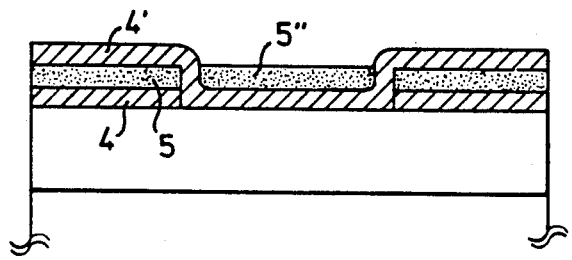

Thereafter, flattened second mask layer 5' is etched back to produce second mask layer 5" so that second transcription layer 4' is exposed as shown in FIG. 2(D).

Figure 2E:
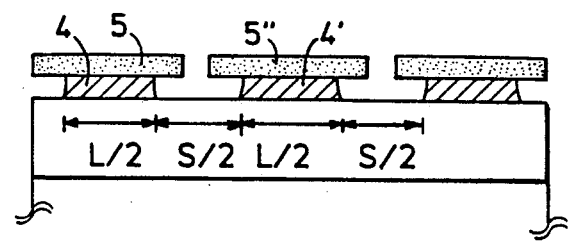

Successively, first and second intermediate transcription layers 4 and 4' are partially removed by an isotropic dry etch so as to make the line width and the line space of the intermediate transcription layers 4 and 4' to be approximately L/2 and S/2, respectively, as shown in FIG. 2(E).

Figure 2F:
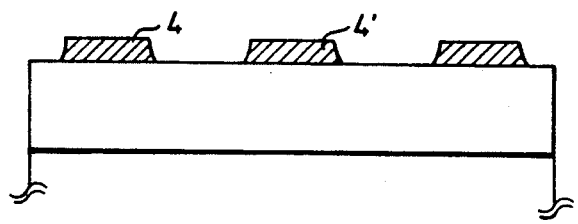
Figure 2G:
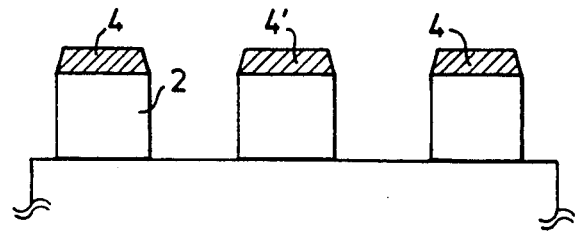

Thereafter, mask layers 5 and 5" are removed by executing a wet etching as shown in FIG. 2(F), and the layer to be transcribed, layer 2, is anisotropic dry etched by using intermediate transcription layers 4 and 4' as a mask as shown in FIG. 2(G).

Figure 2H:
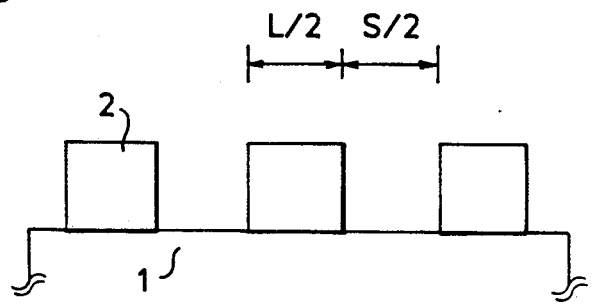

Subsequently, the patterning is completed by removing intermediate transcription layers 4 and 4' by a wet etching process as shown in FIG. 2(H).

Thus, the method of the present invention for forming a fine pattern of semiconductor element enables a minimum line width and line space to be decreased to ½ times compared with the line width and space of a conventional technique.

While a preferred embodiment of the present invention has been illustrated and described, it is anticipated that various changes and modifications will be apparent to those skilled in the art, and that such changes may be made without departing from the spirit and scope of the present invention as defined by the following claims:

What is claimed is:

1. A method for patterning a layer on a semiconductor substrate comprising the steps of:

forming the layer to be patterned on the silicon substrate;

forming a first intermediate transcription layer on the layer to be patterned, the first intermediate transcription layer having a thickness of $\delta$;

forming a first mask layer on the first intermediate transcription layer, the first mask layer having a large etch rate selectivity difference from that of the first intermediate transcription layer;

patterning the first mask layer and the first intermediate transcription layer to have a line width of L and a line space of S, where S is approximately equal to $L+2\delta$;

forming a second intermediate transcription layer with a thickness of approximately $\delta$, the second intermediate transcription layer comprising the same material as the first intermediate transcription layer;

forming a second mask layer having a substantially flattened surface, the second mask layer comprising the same material as the first mask layer;

etching back the flattened second mask layer so as to expose a portion of the second intermediate transcription layer on the first mask layer;

forming a pattern of the first and second intermediate transcription layers with a line width and a line space approximately equal to L/2 and S/2, respectively, by isotropic etching partially the first and second intermediate transcription layers; and removing the remaining portions of the first and second mask layers;

transcribing the pattern of the first and second intermediate transcription layers to the layer to be patterned by anisotropic dry etching the layer to be patterned, wherein the first and second intermediate transcription layers serve as a mask; and removing the first and second intermediate transcription layers.

2. The method of claim 1, wherein the first and second intermediate transcription layers comprise silicon nitride.

3. The method of claim 1, wherein the first and second mask layers comprise spin on glass.

4. The method of claim 1, wherein the first and second intermediate transcription layers comprise silicon nitride and the first and second mask layers comprise spin on glass.

5. The method of claim 1, wherein the step of forming the second mask layer comprises the steps of:

forming a layer of material, the layer of material comprising the same material as the first mask layer; and flattening the layer of material, wherein a second mask layer having a substantially flattened surface is produced.

* * * * *